(12) United States Patent
Hasbani

(10) Patent No.: US 9,013,228 B2
(45) Date of Patent: Apr. 21, 2015

(54) METHOD FOR PROVIDING A SYSTEM ON CHIP WITH POWER AND BODY BIAS VOLTAGES

(71) Applicant: STMicroelectronics SA, Montrouge (FR)

(72) Inventor: Frédéric Hasbani, Hurtieres (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 14/160,369

(22) Filed: Jan. 21, 2014

(65) Prior Publication Data

US 2014/0132338 A1    May 15, 2014

Related U.S. Application Data

(63) Continuation-in-part of application No. 13/669,259, filed on Nov. 5, 2012, now abandoned, which is a continuation of application No. 13/528,640, filed on Jun. 20, 2012, now abandoned.

(30) Foreign Application Priority Data

Jun. 20, 2011    (FR) ...................................... 1155406

(51) Int. Cl.
   *G05F 1/10* (2006.01)
   *H03K 19/00* (2006.01)
(52) U.S. Cl.
   CPC ........ *H03K 19/0016* (2013.01); *H03K 19/0013* (2013.01); *H03K 2217/0018* (2013.01)
(58) Field of Classification Search
   CPC ........................ H03K 19/0013; H03K 19/0016
   USPC .................................. 327/535, 544, 407, 408
   See application file for complete search history.

(56) References Cited

U.S. PATENT DOCUMENTS

| | | | |
|---|---|---|---|
| 4,985,703 | A | 1/1991 | Kaneyama |
| 5,557,231 | A | 9/1996 | Yamaguchi et al. |
| 6,046,627 | A | 4/2000 | Itoh et al. |
| 6,097,113 | A | 8/2000 | Teraoka et al. |
| 6,160,437 | A * | 12/2000 | Kim et al. ..................... 327/408 |
| 6,232,793 | B1 * | 5/2001 | Arimoto et al. ................. 326/34 |
| 6,333,571 | B1 * | 12/2001 | Teraoka et al. ............... 307/125 |

(Continued)

OTHER PUBLICATIONS

French Search Report for corresponding French Application No. FR1155406, dated Feb. 3, 2012, 7 pages.

(Continued)

*Primary Examiner* — Thomas J Hiltunen
(74) *Attorney, Agent, or Firm* — Seed IP Law Group PLLC

(57) ABSTRACT

Embodiments described in the present disclosure relate to a method for providing power for an integrated system, including acts of: providing the system with power, ground and body bias voltages, the body bias voltages comprising a body bias voltage of p-channel MOS transistors, greater or lower than the supply voltage, and a body bias voltage of n-channel MOS transistors, lower or greater than the ground voltage, selecting by means of the system out of the voltages provided, depending on whether a processing unit of the system is in a period of activity or inactivity, voltages to be supplied to bias the bodies of the MOS transistors of the processing unit, and providing the bodies of the MOS transistors of the processing unit with the voltages selected.

20 Claims, 10 Drawing Sheets

(56) References Cited

U.S. PATENT DOCUMENTS

| | | | |
|---|---|---|---|
| 6,605,977 B2 * | 8/2003 | Martini | 327/427 |
| 6,628,159 B2 * | 9/2003 | Voldman | 327/534 |
| 6,900,688 B2 * | 5/2005 | Tomari et al. | 327/534 |
| 6,943,613 B2 | 9/2005 | Miyazaki et al. | |
| 7,123,076 B2 | 10/2006 | Hatakeyama et al. | |
| 7,432,754 B2 * | 10/2008 | Kase et al. | 327/408 |
| 7,492,210 B2 * | 2/2009 | Imai et al. | 327/407 |
| 7,580,310 B2 * | 8/2009 | Chu | 365/222 |
| 7,612,604 B2 * | 11/2009 | Miyazaki et al. | 327/534 |
| 7,936,187 B1 * | 5/2011 | Wu et al. | 327/94 |
| 7,940,111 B2 * | 5/2011 | Soltanian et al. | 327/403 |
| 8,344,789 B2 * | 1/2013 | Webb | 327/534 |
| 2001/0006352 A1 | 7/2001 | Toyoyama et al. | |
| 2003/0076152 A1 | 4/2003 | Bazes | |
| 2003/0102902 A1 | 6/2003 | Kitamoto | |
| 2004/0016977 A1 | 1/2004 | Miyazaki et al. | |
| 2005/0083108 A1 | 4/2005 | Kiriaki | |
| 2006/0066388 A1 * | 3/2006 | Tschanz et al. | 327/534 |
| 2007/0262810 A1 | 11/2007 | Lee et al. | |
| 2008/0272825 A1 | 11/2008 | Miyada | |
| 2010/0066431 A1 | 3/2010 | Carter | |
| 2011/0032021 A1 * | 2/2011 | Dianbo | 327/427 |
| 2012/0299637 A1 * | 11/2012 | Company Bosch et al. | 327/437 |
| 2013/0057334 A1 | 3/2013 | Hasbani et al. | |

OTHER PUBLICATIONS

Kuroda, T., "A High-Speed Low-Power 0.3 μm CMOS Gate Array with Variable Threshold Voltage (VT) Scheme," XP000683285, Proceedings of the IEEE 1996 Custom Integrated Circuits Conferences, San Diego, California, USA, May 5-8, 1996, pp. 53-56.

* cited by examiner

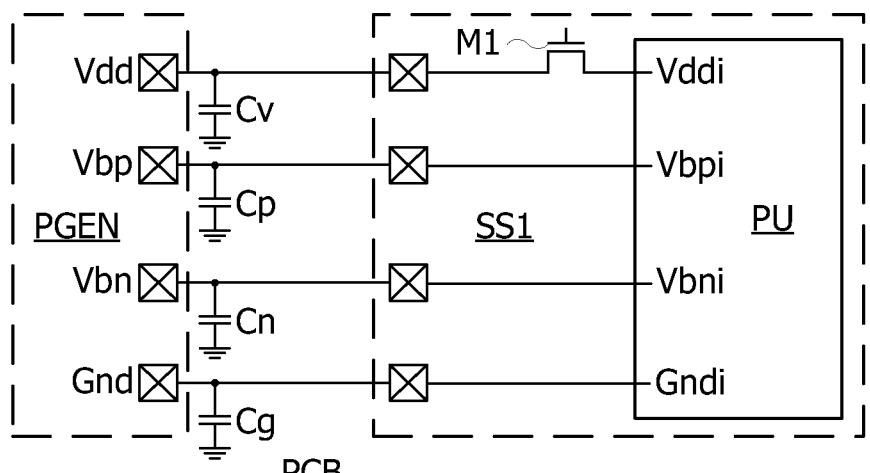
Fig. 1
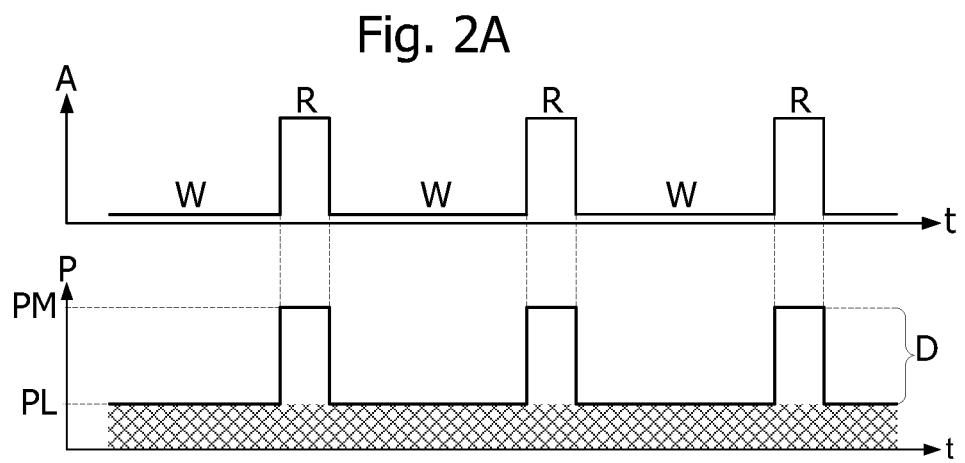
Fig. 2A
Fig. 2B

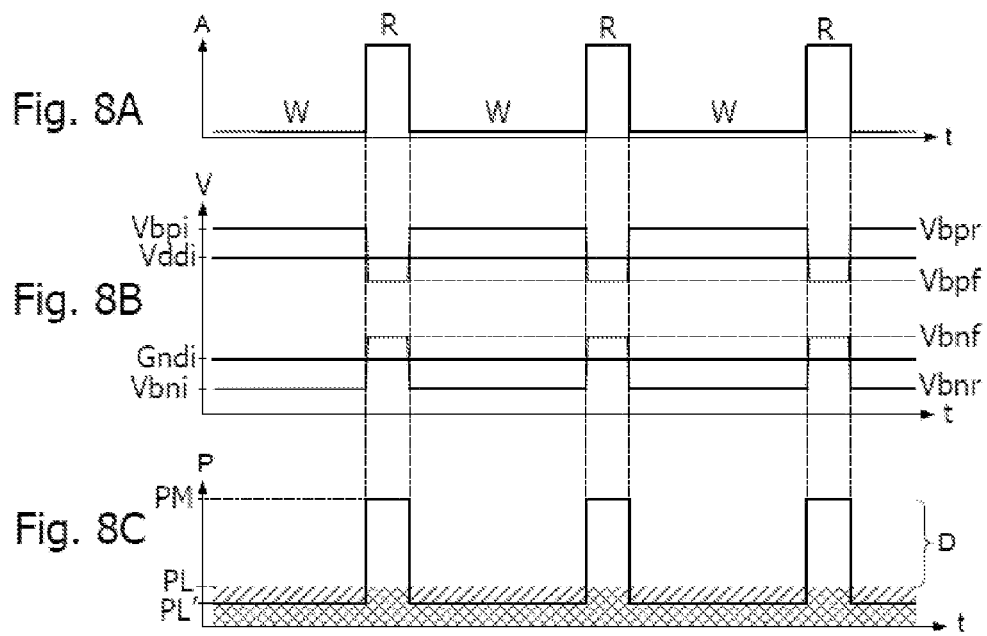
Fig. 8A
Fig. 8B
Fig. 8C
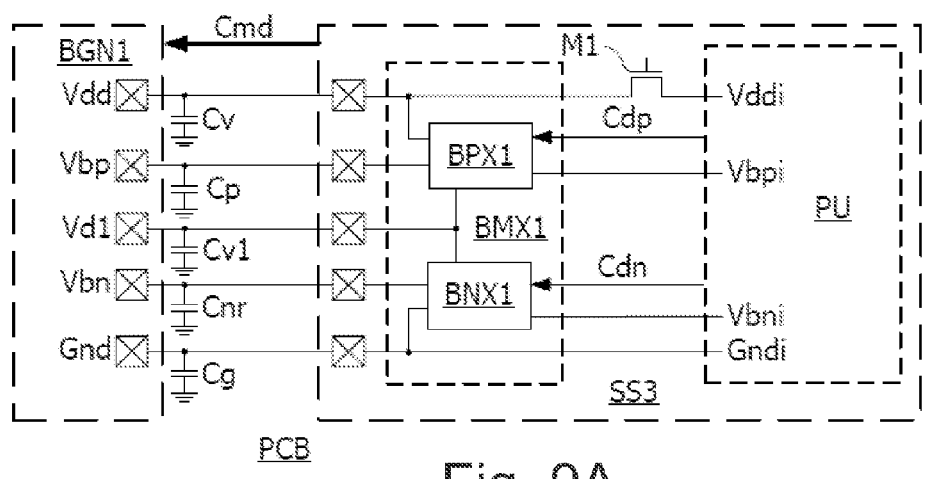
Fig. 9A

METHOD FOR PROVIDING A SYSTEM ON CHIP WITH POWER AND BODY BIAS VOLTAGES

CROSS-REFERENCE TO RELATED APPLICATIONS

This application is a continuation-in-part of U.S. patent application Ser. No. 13/669,259, currently pending, which is a continuation of U.S. patent application Ser. No. 13/528,640, filed Jun. 20, 2012, which claims priority to French Application No. 1155406, filed Jun. 20, 2011; these applications are incorporated herein by reference in their entireties.

BACKGROUND

1. Technical Field

The present disclosure relates to the management of the electrical power supply of systems such as integrated circuits. The present disclosure particularly applies to Systems on Chip (SoC).

2. Description of the Related Art

Recently, particularly with the development of mobile systems, the current consumption of circuits has become a key constraint when designing architectures of systems such as microprocessors. Furthermore, the increasing miniaturization of integrated circuits tends to reduce the threshold voltages of transistors and thus to increase leakage currents. Therefore, the current consumption due to leakage currents tends to become comparable to the current consumption resulting from the activity of a microprocessor. Traditionally, priority was given to the computing power. As a result, the supply voltage was set at the maximum possible value. However, many applications executed by a microprocessor do not continuously require a maximum computing power. Thus, an application designed to receive for example user commands or data from a telecommunications network, can often find itself waiting for commands or data. During these waiting periods, the application does not require a maximum computing power.

It has therefore been suggested to use such periods of low activity of a circuit to reduce the supply voltage, and thus reduce the current consumption of the circuit. Methods for adapting the supply voltage such as AVS (Adaptative Voltage Scaling) and DVS (Dynamic Voltage Scaling) have been developed to adapt the supply voltage of a system such as a microprocessor to the activity of the latter. These methods prove efficient in reducing the current consumption, but do not efficiently reduce the leakages occurring in the circuits, particularly when the activity of the microprocessor is low. These methods require the clock frequency of the system to be adapted at the same time as the supply voltage, which implies a transition time to change between two levels of supply voltage that can reach several hundred microseconds. Such a time can be unacceptable in certain applications.

Therefore methods for adapting the body biasing of transistors known as Adaptive Body Biasing (ABB), particularly to reduce leakage currents, have also been proposed. Some of these methods, called RBB (Reverse Body Biasing), involve biasing the bodies of n-channel MOS transistors of a circuit to a negative bias voltage (lower than the ground of the circuit), and the bodies of p-channel MOS transistors to a voltage greater than the supply voltage of the circuit. RBB-type methods enable the current leakages to be reduced, at constant supply voltage, but cause an increase in the threshold voltage of the transistors and thus a decrease in the processing speed. Other methods called FBB (Forward Body Biasing) involve biasing the bodies of the n-channel MOS transistors in a circuit to a bias voltage greater than the ground of the circuit, and the p-channel MOS transistors to a bias voltage lower than the supply voltage of the circuit. FBB-type methods enable the threshold voltage of the transistors to be decreased and thus the processing speed of a circuit to be increased, or the supply voltage of the circuit to be decreased without reducing the processing speed.

Systems on chip generally include several integrated circuits on a same chip. To reduce the current consumption of a system on chip, all the circuits of the system are not necessarily all supplied with power continuously. As a result, the load impedance of the power supply circuit of the system varies according to the size of the area of the system supplied with power at a given instant. It is therefore difficult to integrate a power supply circuit into a system on chip. This is why the power supply circuit of such a system is often remote and at least partly located in another integrated circuit which can be connected to the system, for example through conductive paths formed on a substrate such as a printed circuit board on which the system and its power supply circuit, as well as capacitors are arranged.

FIG. 1 schematically represents a system on chip SS1 and its power supply circuit PGEN. The circuit PGEN includes a terminal for providing the supply voltage Vdd and a ground terminal Gnd. The terminals receiving the voltages Vdd and Gnd can be linked to supply terminals of the system SS1, by conductive paths formed on a substrate such as a printed circuit board PCB. Each of these conductive paths is linked to the ground of the substrate (e.g., printed circuit) through a capacitor Cv, Cg also installed on the substrate (e.g., printed circuit board). The system SS1 includes several circuits. For the sake of clarity, only one of these circuits, of the system processing unit PU type, is represented. Each of these circuits and particularly the unit PU receives the supply voltage Vdd through a switch formed for example by a transistor Ml, and the ground voltage Gnd. The transistor Ml is controlled so as to be on when the processing unit PU must be power supplied. The capacitors Cv, Cg which represent a capacitance in the order of 0.1 to 1 μF, enable the load impedance of the voltage generating circuits of the circuit PGEN to be set to a value substantially independent of the size of the area of the system SS1 to be power supplied at a given instant. The capacitance of the capacitors Cv, Cg depends on the maximum power to be provided by the circuit PGEN.

The method ABB can be implemented in the circuit in FIG. 1 by providing that the circuit PGEN supplies body bias voltages Vbn, Vbp of n- and p-channel MOS transistors of the system SS1. Like for the voltages Vdd and Gnd, the voltages Vbn and Vbp are provided by links connected to the ground through capacitors Cn, Cp having a capacitance in the order of 0.1 to 1 μF. The capacitors Cv, Cg, Cn, Cp form, together with the conductive paths between the circuit PGEN and the system SS1, impedances introducing relatively high time constants. The voltages Vdd, Vbn and Vbp cannot therefore be changed by the circuit PGEN to follow the fast changes in the activity of the system SS1 with a sufficiently short response time, which varies according to the application implemented by the system. For an application involving short, frequent periods of activity, for example of Web surfing type, this response time may be lower than 200 ns. Given the frequency of the periods of activity, a higher response time would amount to operating the system with a lower clock frequency and thus to increasing the operating time of the system. As a result, the current consumption gain would be lower. In addition, a higher response time would also be disadvantageous for the user and the operating system of the system on chip.

The links between the circuits PGEN and SS1 and the capacitors introduce relatively high time constants, preventing fast changes to the supply voltage Vdd provided by the circuit PGEN, for example according to the activity of the system SS1.

FIGS. 2A, 2B are timing diagrams of variations in the activity and in the electrical power consumption of the processing unit PU. The variations in the electrical power in FIG. 2B relate to the activity of the processing unit PU indicated by the timing diagram in FIG. 2A. In FIG. 2A, the activity of the processing unit PU has periods of activity R spaced out by waiting periods or periods of relatively low activity W during which the unit PU is waiting for an external event, for example the arrival of a data stream by a communication interface or a command from a user interface device. In FIG. 2B, the electrical power PM consumed by the unit PU is maximum during the periods of activity R. During the waiting periods W, the electrical power consumption of the unit PU has a value PL which can be between a quarter and a third of the maximum power consumption. The power PL is mainly due to the leakage currents of the circuit, while the power PM is equal to the sum of the power D consumed by the circuit due to its activity and the power PL. The waiting periods W may represent a high proportion of the total time which can reach values between 50% and 90%. During the periods W, the data must be kept in the memories and registers of the unit PU, and the flip-flops of the unit PU must keep the same state. During certain periods of inactivity, the unit PU must be able to reach a high activity in a minimum amount of time, which may be lower than 200 ns. Therefore, the supply voltage Vdd of the processing unit cannot be cut off or reduced. The result is that during a given period, the leakage electrical power may be greater than the electrical power consumed by the unit PU due to its activity.

It is therefore desirable to reduce the current leakages without reducing the computing power of a system, particularly of a system powered by an external circuit. It is also desirable to be able to adapt the electrical power supply of a system according to the activity of the latter with response times lower than the time constants of the power supply connections of the system, so as to reduce the current consumption of the system.

BRIEF SUMMARY

Some embodiments relate to a method for providing power for an integrated system, the method includes providing the system with supply, ground and body bias voltages, the body bias voltages having a body bias voltage of p-channel MOS transistors, greater or lower than the supply voltage, and a body bias voltage of n-channel MOS transistors, lower or greater than the ground voltage, selecting by means of the system out of the voltages provided, voltages for biasing the bodies of the MOS transistors of a processing unit in the system, and supplying the bodies of the MOS transistors of the processing unit with the voltages selected.

According to one embodiment, the voltages for biasing the bodies of the MOS transistors of the processing unit are selected out of the voltages supplied, depending on whether the processing unit is in a period of activity or inactivity.

According to one embodiment, the method includes, during the periods of inactivity of the processing unit, acts of supplying the bodies of p-channel MOS transistors of the processing unit with the bias voltage greater than the supply voltage of the system, and the bodies of n-channel MOS transistors of the processing unit, with the bias voltage lower than the ground voltage.

According to one embodiment, the method includes, during the periods of activity or inactivity of the processing unit, acts of supplying the bodies of p-channel MOS transistors of the processing unit with the supply voltage of the system, and the bodies of re-channel MOS transistors of the processing unit with the ground voltage.

According to one embodiment, the method includes, during the periods of activity of the processing unit, acts of supplying the bodies of p-channel MOS transistors of the processing unit with the bias voltage lower than the supply voltage of the system, and the bodies of n-channel MOS transistors of the processing unit with the bias voltage greater than the ground voltage.

According to one embodiment, the method includes an act of the system controlling a power supply circuit external to the system so that it supplies either a body bias voltage of p-channel MOS transistors, greater than the supply voltage, and a body bias voltage of n-channel MOS transistors lower than the ground voltage, or a body bias voltage of p-channel MOS transistors lower than the supply voltage, and a body bias voltage of re-channel MOS transistors greater than the ground voltage.

According to one embodiment, the voltages for biasing the bodies of the MOS transistors of the processing unit are selected by the processing unit.

According to one embodiment, the method includes an act of the system controlling a power supply circuit external to the system so that it adjusts the body bias voltages of p-channel transistors of the processing unit to values respectively equal to the supply voltage of the integrated system plus and minus a voltage between 0 and 0.4 V.

According to one embodiment, the method includes an act of the system controlling a power supply circuit external to the system so that it adjusts the body bias voltages of n-channel transistors of the processing unit to values respectively equal to the ground voltage plus and minus a voltage between 0 and 0.4 V.

According to one embodiment, the supply voltage of the integrated system varies between 50% and 120% of a nominal voltage withstood by the transistors of the integrated system.

Some embodiments also include an integrated system having a processing unit and a body bias voltage selecting circuit coupled to the processing unit, the bias voltage selecting circuit being adapted for receiving from a power supply circuit external to the integrated system, a supply voltage, a ground voltage, a body bias voltage of p-channel MOS transistors, greater and/or lower than the supply voltage, and a body bias voltage of n-channel MOS transistors, lower and/or greater than the ground voltage, the integrated system being configured to implement the method as previously defined.

According to one embodiment, the system includes several processing units, each processing unit being coupled to a body bias voltage selecting circuit.

According to one embodiment, the body bias voltage selecting circuit includes a circuit for selecting bias voltages of p-channel MOS transistors to select a bias voltage out of the supply voltage of the integrated system and a bias voltage greater or lower than the supply voltage of the integrated system, and a circuit for selecting bias voltages of n-channel MOS transistors out of the ground voltage of the integrated system and a bias voltage greater or lower than the ground voltage of the integrated system.

According to one embodiment, the body bias voltage selecting circuit includes a circuit for selecting bias voltages of p-channel MOS transistors out of the supply voltage of the integrated system, and bias voltages greater and lower than the supply voltage of the integrated system, and a circuit for selecting bias voltages of n-channel MOS transistors out of the ground voltage of the integrated system and bias voltages greater or lower than the ground voltage of the integrated system.

According to one embodiment, the circuit for selecting body bias voltages of p-channel MOS transistors includes one branch per p-channel MOS transistor body bias voltage, supplied by an external power supply circuit, each branch having a p-channel MOS transistor and an n-channel MOS transistor mounted head-to-tail.

According to one embodiment, the circuit for selecting body bias voltages of n-channel MOS transistors includes one branch per n-channel MOS transistor body bias voltage, supplied by an external power supply circuit, each branch having two n-channel MOS transistors mounted in series.

BRIEF DESCRIPTION OF THE SEVERAL VIEWS OF THE DRAWINGS

Some examples of embodiments described in the present disclosure will be described below in relation with, but not limited to, the following figures.

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements and angles are not drawn to scale, and some of these elements are enlarged and positioned to improve drawing legibility. Further, the particular shapes of the elements as drawn are not intended to convey any information regarding the actual shape of the particular elements and have been solely selected for ease of recognition in the drawings. One or more embodiments are described hereinafter with reference to the accompanying drawings in which:

FIG. 1 previously described schematically represents an integrated system connected to an external power supply circuit, FIGS. 2A, 2B previously described are timing diagrams of the activity and of the electrical power consumption of a processing unit of the integrated system, FIG. 3 schematically represents an integrated system connected to an external power supply circuit, according to one embodiment.

DETAILED DESCRIPTION

Figure 3:
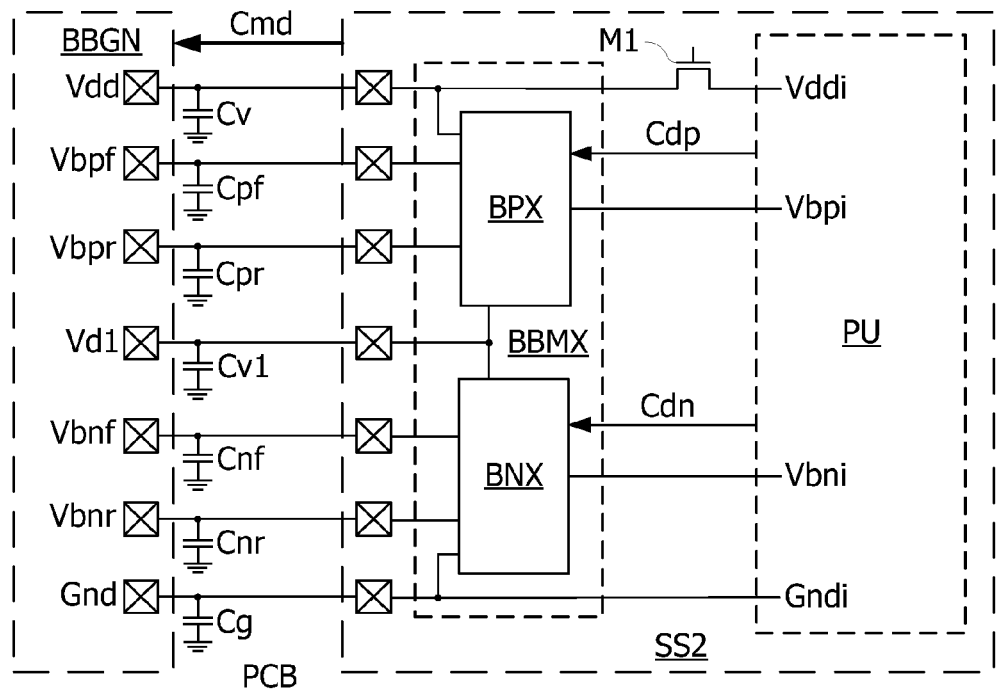

FIG. 3 represents an integrated system SS2, such as a system on chip (SoC), linked to an external power supply circuit BBGN, through a substrate, for example, a printed circuit board PCB. The circuit BBGN includes terminals for providing supply Vdd and ground Gnd voltages.

The circuit BBGN also includes terminals Vbpf, Vbpr, Vbnf, Vbnr, Vd1 for providing body bias voltages and a supply voltage greater than the voltage provided by the terminal Vdd. In some embodiments, the supply voltage is greater than the voltage provided by the terminal Vbpr which is greater than Vdd. Each of the terminals for providing voltages Vdd, Gnd, Vbpf, Vbpr, Vbnf, Vbnr, Vd1 of the circuit BBGN is linked to a respective terminal of the system SS2, by a conductor path formed on the substrate, (e.g., printed circuit board PCB) and linked to the ground of the substrate (e.g., printed circuit) through a respective capacitor Cv, Cg, Cpf, Cpr, Cnf, Cnr, Cv1, installed on the plate substrate (e.g., PCB). The capacitors Cv, Cg, Cpf, Cpr, Cnf, Cnr, Cv1 each have a capacitance in the order of 0.1 to 1 µF. The system SS2 includes several circuits, only one processing unit PU of which is represented for the sake of clarity. The unit PU receives the supply voltage Vdd, via a supply terminal Vddi, through a switch formed for example by a p-channel MOS transistor M1. The transistor M1 is controlled so as to be on to supply the processing unit PU with power. The unit PU also includes a ground terminal Gndi connected to the terminal Gnd.

Figure 4:
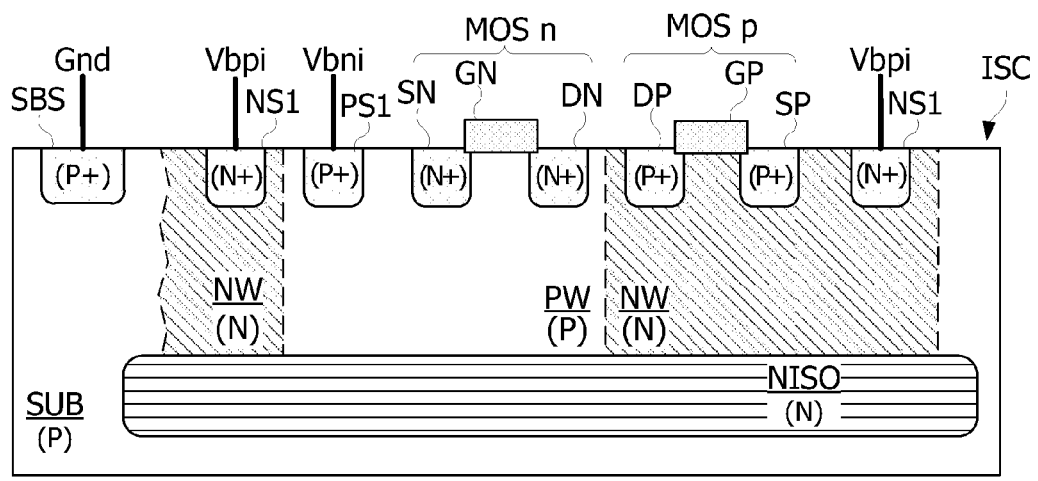
FIGS. 4 and 5 represent in a cross-section and a top view a part of a processing unit of the integrated system.
Figure 5:
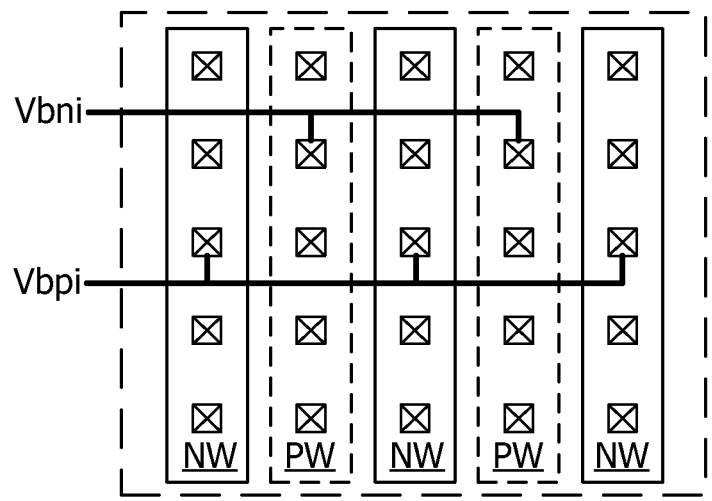

FIGS. 4 and 5 represent a part of the unit PU of the system SS2. The system SS2 is formed on a substrate SUB made of a semi-conductive material of p-conductivity type. The substrate SUB includes a p+ doped region SBS forming a substrate tap connected to a substrate ground Gnd. The unit PU includes a buried body NISO of n-conductivity type and, above the body NISO, several elongated bodies NW, PW arranged parallel to each other, formed in the substrate until the body NISO is reached. The bodies NW are of n-conductivity type and the bodies PW of p-conductivity type.

The bodies NW includes doped regions N+ NS1 forming body taps intended to receive the body bias voltage Vbpi. The bodies NW also include P+ doped regions DP, SP respectively forming the drain and the source of p-channel transistors each having a gate GP formed above an area forming the channel of the transistor, between the source SP and drain DP regions. The bodies PW include P+ doped regions PS1 forming body taps intended to receive the body bias voltage Vbni. The bodies PW also include two N+ doped regions SN, DN respectively forming the source and the drain of n-channel MOS transistors each having a gate GN formed above an area between the source SN and drain DN regions.

According to one embodiment, reverse body biasing RBB and forward body biasing FBB methods are implemented in the circuit in FIG. 3. For this purpose, the circuit BBGN provides body bias voltages Vbnf, Vbnr, Vbpf, Vbpr for the bodies of the system SS2, enabling the implementation of the RBB and FBB modes. For its part, the system SS2 includes a supply voltage selecting circuit BBMX associated with the processing unit PU, enabling one or other of the RBB and FBB modes to be activated or deactivated. The circuit BBMX includes two switch circuits BNX, BPX. The circuit BPX is connected to the terminals for providing the voltages Vdd, Vbpf, Vbpr, and Vd1 and provides the unit PU with a voltage Vbpi. The circuit BNX is connected to the terminals for providing the voltages Vd1, Vbnf, Vbnr and Gnd, and provides the unit PU with a voltage Vbni. The circuits BPX, BNX receive from the unit PU command signals Cdp, Cdn for controlling the supply to the terminal Vbpi of one of the voltages Vbpf, Vbpr and Vdd, and to the terminal Vbni, of one of the voltages Vbnf, Vbnr and Gnd, for example depending on the activity of the unit PU. The voltage Vbpi is used to bias the bodies of the p-channel MOS transistors of the unit PU, and the voltage Vbni to bias the bodies of the n-channel MOS transistors of the unit PU. As the selection between the voltages Vbpf, Vbpr and Vdd, on the one hand and, on the other, between the voltages Vbnf, Vbnr and Gnd is done by circuits of the system SS2, it does not depend on electrical connection time constants. This selection can therefore be done as swiftly as necessary to achieve current consumption gains, given the duration and frequency of periods of activity of the unit PU. Thus, the time for switching between one or other of these voltages can for example be lower than 200 ns, or even lower than 100 ns. It is therefore possible to implement one or other of the RBB, FBB modes in a dynamic manner, depending on the activity of the processing unit PU.

Figure 6:
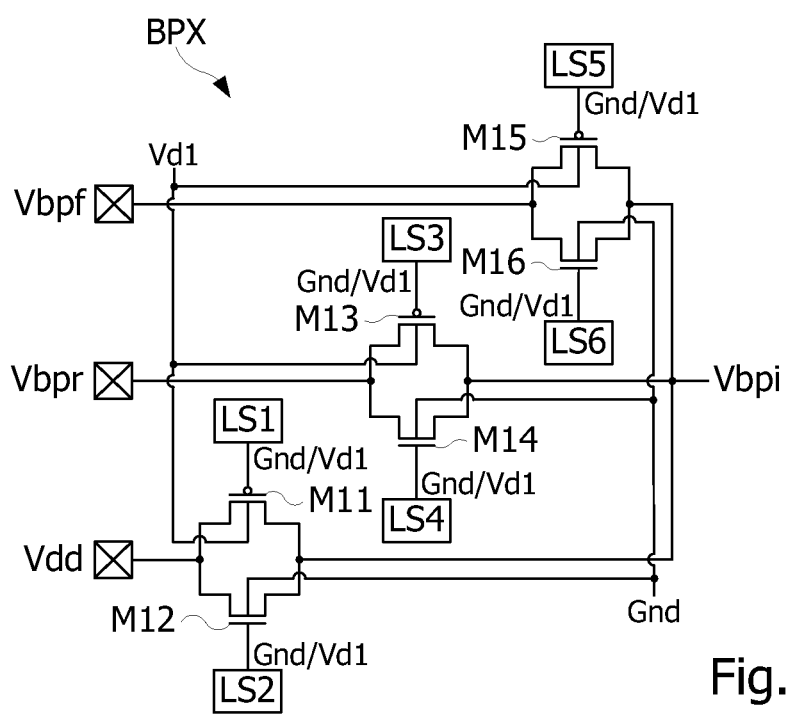
FIG. 6 represents an embodiment of the p-channel body-bias voltage selecting circuit of the integrated system of FIG. 3, FIGS. 7A-7D represent different embodiments of an n-channel body-bias voltage selecting circuit of the integrated system in FIG. 3, FIGS. 8A, 8B and 8C are timing diagrams respectively of the activity, supply voltages and the electrical power consumption of the integrated system, FIGS. 9A-9C schematically represent integrated system embodiments connected to an external power supply circuit.

FIG. 6 represents an example of an embodiment of the circuit BPX. The circuit BPX includes three branches respectively connected to the terminals Vdd, Vbpf, Vpbr. Each branch includes a p-channel MOS transistor M11, M13, M15, and an n-channel MOS transistor M12, M14, M16, mounted head-to-tail. The bodies of the transistors M11, M13, M15 are biased by the voltage Vd1, and the bodies of the transistors M12, M14, M16 are grounded. The gate of each transistor M11-M16 is connected to a voltage converter circuit LS1-LS6 providing the gate of the transistor with either a zero voltage (grounded) or with a voltage equal to Vd1. The circuits LS1-LS6 are controlled so that the output voltage Vbpi of the circuit BPX is equal either to the voltage Vdd, or to the voltage Vbpf, or to the voltage Vbpr. The circuits LS1-LS6 are configured to provide sufficient voltages to switch the transistors M11-M16, given that their size depends on the other transistors of the system SS2 to withstand voltages (Vd1, Vbpr) greater than the supply voltage of the system Vdd.

The voltage Vd1 may in some cases be greater than Vbpr and Vbpf. In other cases, the voltage Vd1 may be equal to voltage Vbpr. The voltage at Vd1 may be selected to provide proper biasing of transistors M11-M15 in the ON state and proper control of M11, M13, and M15 in the OFF state. That is, selection of a proper voltage at Vd1 will enable transistors M11, M13 and M15 to be properly turned in the OFF region when their respective branch must not be ON. The desired control of the transistors M11-M15 and the proper selection of Vdl may be further supported in the formation of the transistors. That is, in some cases, the BPX1 and BNX1 switch circuits are formed with thick oxide transistors while the processing unit PU is formed with thin oxide transistors.

The presence of two transistors per branch ensures that at least one of the two transistors of the branch is on when the branch must be on. Indeed, the conduction state of each transistor depends on the supply voltage Vdd of the system which can vary significantly, for example between 0.6 and 1.2 V particularly in the case of a battery-powered system. The presence of two transistors per branch also enables a resistance to be obtained when the branch is on, that is substantially independent of the variations in the various voltages provided to the circuit.

FIGS. 7A-7D represent exemplary embodiments of the circuit BNX. The circuit BNX includes three branches each linking one of the terminals Gnd, Vbnr, Vbnf to the terminal Vbni. Each branch includes two n-channel MOS transistors, M21 and M22, M23 and M24 and M25, M26, respectively, mounted in series. The body bias terminals of the transistors M23, M24, M25, M26 are connected to the terminal Vbnr.

Figure 7A:
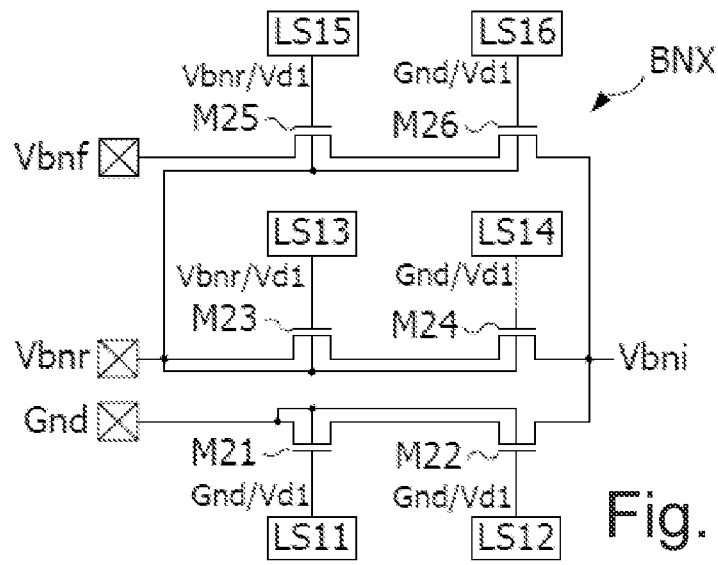
Figure 7B:
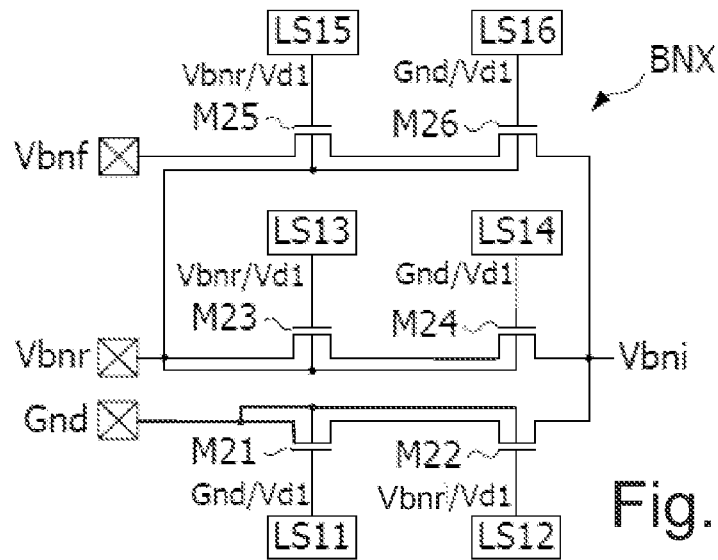
Figure 7C:
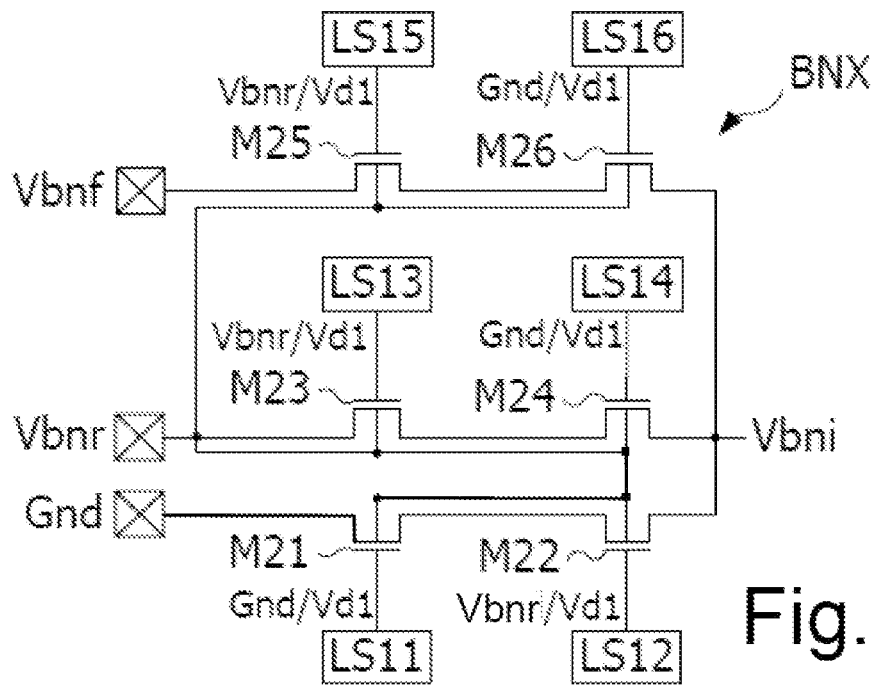
Figure 7D:
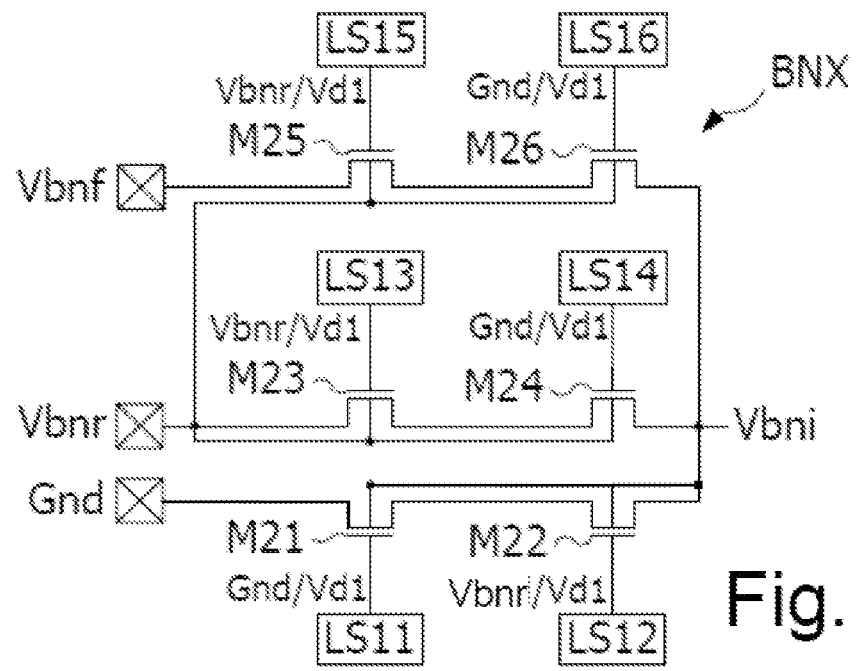

In some cases, the body bias terminals of the transistors M21, M22 are connected to the terminal Gnd, as illustrated in FIGS. 7A-7B. In other cases, the body bias terminals of the transistors M21, M22 are connected to the terminal Vbnr, as illustrated in FIG. 7C. In still other cases, such as illustrated in FIG. 7D, the body bias terminals of the transistors M21, M22 are connected to the terminal Vbni. These optional configurations are illustrated in FIGS. 7A-7D. Generally speaking, the BNX circuit will perform as expected when body bias terminals of the transistors M21, M22 are connected to the terminal Gnd. In order to provide a larger voltage range in the negative voltage domain, however, the circuit may be configured with the M21, M22 transistors or at least the M22 transistor connected to the terminal Vbnr or Vbni as illustrated in FIGS. 7C-7D.

When the M21, M22 transistor body bias terminals are connected to Gnd, the lower range of the Vbni voltage tends to be limited to about minus 0.4V before the M22 body diode turns in the forward region. This effect may be undesirable in some cases such as when the negative voltage generating circuit is a charge-pump-based circuit, which may be unable to drive large currents. Alternatively, at least the M22 body terminal can be optionally connected to Vbnr or Vbni, and such configureation will work to prevent the M22 body diode from turning in the forward region when Vbni is negative.

The gate of each transistor M21-M26 is connected to a voltage converter circuit LS11-LS16. The circuit LS11 provides the gate of the transistor M21 with either the voltage at the terminal Gnd, or with the voltage Vd1.

In FIG. 7A, circuits LS13, LS15 provide the gate of the transistors M23, M25, with either the voltage at the terminal Vbnr, or with the voltage Vd1. The circuits LS12, LS14, LS16 respectively provide the gates of the transistors M22, M24, M26 with either the voltage at the terminal Gnd or with the voltage Vd1.

In FIGS. 7B-7D, the circuits LS12, LS13, LS15 provide the gate of the transistors M22, M23, M25, with either the voltage at the terminal Vbnr, or with the voltage Vd1. The circuits LS14, LS16 respectively provide the gates of the transistors M24, M26 with either the voltage at the terminal Gnd or with the voltage Vd1.

The circuits LS11-LS16 are controlled so that the output voltage Vbni of the circuit BNX is equal either to the voltage of the ground Gnd, or to the voltage Vbnr, or to the voltage Vbnf. The circuits LS11-LS16 are configured to provide sufficient voltages to switch the transistors M21-M26, given that their size depends on the other transistors of the system SS2 to withstand voltages (Vd1) greater than the supply voltage Vdd of the system and negative voltages Vbnr (lower than the ground voltage). The presence of two transistors per branch controlled by different voltages ensures that at least one of the two transistors of the branch is off when the branch must not be on.

As an example, the voltage Vdd is between 50% and 120% of the nominal voltage withstood by the transistors of the integrated circuit. Thus, the voltage Vdd is for example between 0.6 and 1.2 V, the voltage Vd1 is between 1.6 and 2 V, the voltages Vbpf and Bbpr are respectively lower and greater by 0.3 to 0.4 V than the supply voltage Vdd, and the voltages Vbnf and Vbnr are respectively greater and lower by 0.3 to 0.4 V than the ground voltage. The differences of 0.3 to 0.4 V between the body bias voltages and the power and ground voltages are chosen so as to always remain below the threshold voltage of junction diodes formed between the bodies and the substrate, given variations in this threshold voltage resulting from variations in the manufacturing conditions of the integrated system.

FIGS. 8A to 8C are timing diagrams showing the operation of the circuit BBMX. FIG. 8A represents the activity of the unit PU. The activity of the unit PU includes periods of activity R spaced out by waiting periods W, during which the unit PU is waiting for an external event, for example the arrival of a data stream by a communication interface or a command from a user interface.

FIG. 8B represents in connection with the timing diagram of the activity of the unit PU, timing diagrams of the voltages Vddi, Gndi, Vbpi and Vbni provided to the processing unit PU. The voltages Vbpr and Vbnr are respectively greater than the voltage Vdd and lower than the voltage Gnd, and the voltages Vbpf and Vbnf are respectively lower than the voltage Vdd and greater than the voltage Gnd. The circuit BBMX is controlled so as to set the voltages Vbpi and Vbni respectively to Vbpr and Vbnr during the periods W (RBB mode) and to Vbpf and Vbnf during the periods R (FBB mode). It shall be noted that the circuits BNX, BPX also enable the voltages Vbpi and Vbni to be respectively set to the voltages Vdd and Gnd. This possibility can particularly be used during the start up of the external power supply circuit BBGN when the voltages Vbpf, Vbnf, Vbpr and Vbnr are not yet established.

FIG. 8C represents in connection with the timing diagrams of FIGS. 8A, 8B, the electrical power consumption of the unit PU. During the periods of activity R, the electrical power PM consumption of the processing unit PU is maximum and breaks down into an electrical power consumption D due to the actual activity of the unit PU and a dissipated electrical power PL due to the current leakages. During the periods W, the electrical power consumption PL' is mainly dissipated by the current leakages in the circuits of the unit PU. Thanks to the implementation of the RBB mode, the electrical power PL' is lower than that (PL) consumed during periods of inactivity W when the bodies are biased by the voltages Vbnf and Vbpf, or than that consumed by leakages during periods of activity R.

Thus, the reduction in the current consumption is not obtained to the detriment of the performance of the processing unit PU in terms of processing speed or power.

According to one embodiment, the circuit BBMX is controlled by the processing unit PU.

According to one embodiment, the system SS2 includes several processing units each associated with a switch circuit such as the circuit BBMX, so as to adapt the body bias voltages of each processing unit to the activity of the latter, and thus reduce the current consumption of the system, without affecting its computing power.

According to simplified embodiments of the circuits BNX, BPX, one of the three branches of each of the circuits BPX, BNX is removed. According to one of these embodiments, the branches of the circuits BNX, BPX connected to the terminals Vdd and Gnd can be removed. Thus, the processing unit PU is powered either in FBB mode during its periods of activity, or in RBB mode during its periods of inactivity.

According to another embodiment, the branch connected to the terminal Vbnf in the circuit BNX and the branch connected to the terminal Vbpf in the circuit BPX can be removed. In this embodiment, the voltage Vbni is either equal to the voltage Vbnr, during the periods of inactivity or of low activity of the processing unit PU, or equal to the ground voltage during the periods of activity of the unit PU. Similarly, the voltage Vbpi is either equal to the voltage Vbpr during the periods of inactivity or of low activity of the unit PU, or equal to the voltage Vdd during the periods of activity of the unit PU. Therefore, the two links for transmitting the voltages Vbnf and Vbpf between the circuit BBGN and the system SS2 can be removed.

According to another embodiment, the branches of the circuits BNX, BPX, connected to the terminals Vbnr and Vbpr can be removed. In this embodiment, the voltage Vbni is either equal to the voltage Gnd, during the periods of inactivity or of low activity of the processing unit PU, or equal to the voltage Vbnf during the periods of activity of the unit PU. Similarly, the voltage Vbpi is either equal to the voltage Vdd during the periods of inactivity or of low activity of the unit PU, or equal to the voltage Vbpf during the periods of activity of the unit PU. Therefore, the two links for transmitting the voltages Vbnr and Vbpr between the circuit BBGN and the system SS2 can be removed.

Figure 9B:
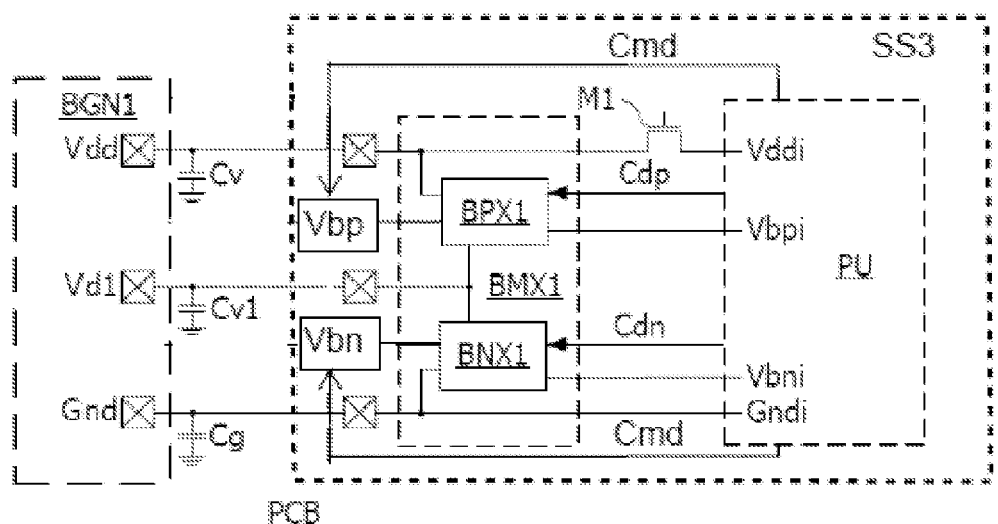
Figure 9C:
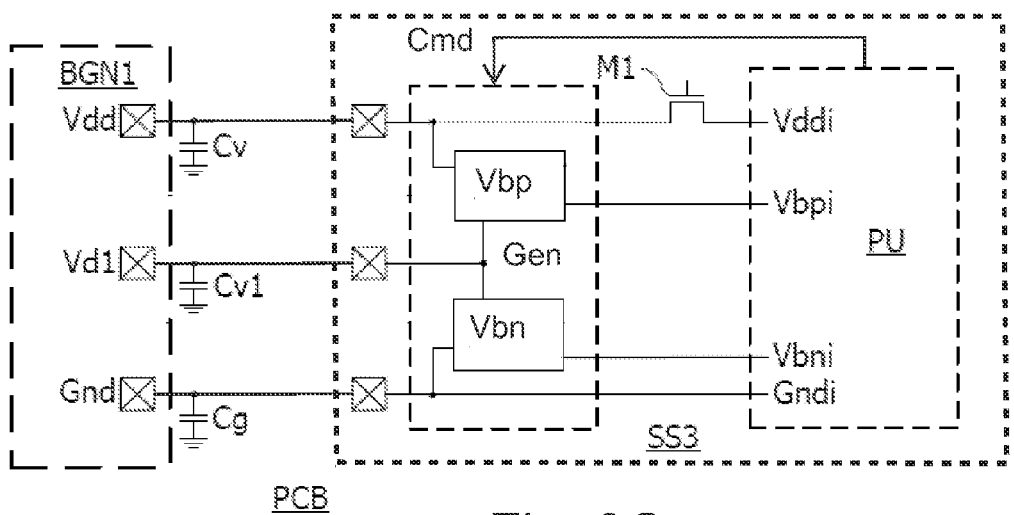
Figure 10:
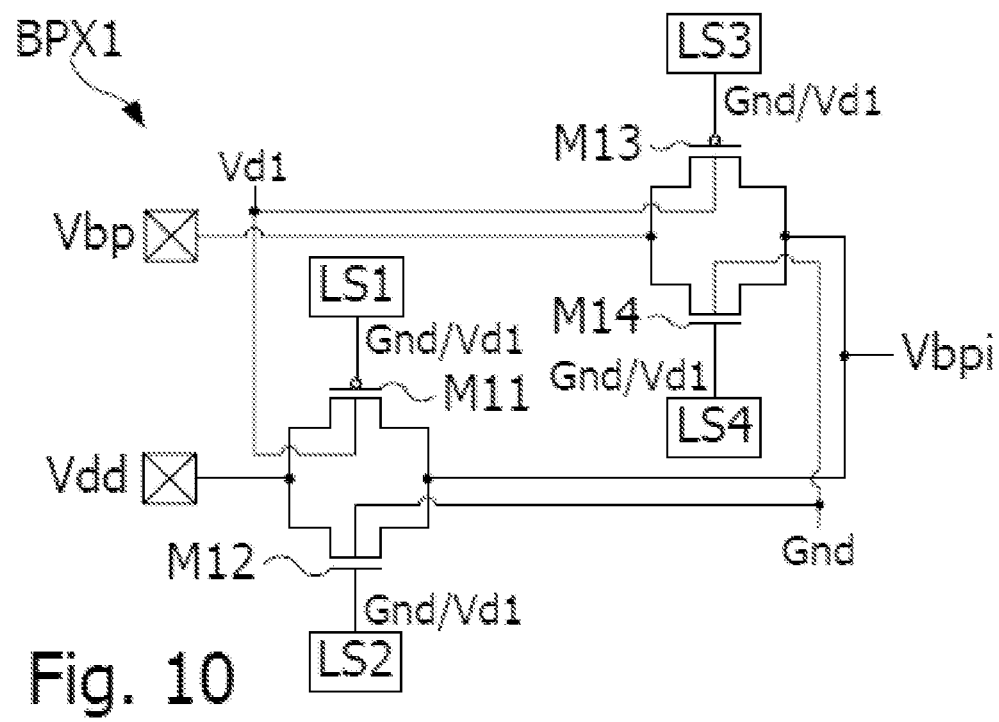
FIG. 10 represents a p-channel supply voltage selecting circuit of the integrated systems in FIGS. 9A-9C, FIGS. 11A-11C represent different n-channel body-bias supply voltage selecting circuits of the integrated systems in FIGS. 9A-9C.

According to another embodiment, illustrated by FIGS. 9A-9C, 10, 11A, 11C, the links for transmitting the voltages Vbnf, Vbnr, Vbpf and Vbpr are removed and replaced with two voltage transmission links that may respectively transmit the voltage Vbnf or Vbnr, and the voltage Vbpf or the voltage Vbpr, depending on commands Cmd sent by the integrated system to the power supply circuit. Thus, FIGS. 9A-9C represent an integrated system SS3 connected through conductive paths of a substrate such as a printed circuit PCB1 to an external power supply circuit BGN1.

In FIG. 9A, the circuit BGN1 differs from the circuit BBGN in that it can be controlled to provide to a terminal Vbp, either the voltage Vbpf, or the voltage Vbpr, and to provide to a terminal Vbn, either the voltage Vbnf, or the voltage Vbnr. For this purpose, the circuit BGN1 receives commands Cmd from the system SS3. The system SS3 differs from the system SS2 in that the circuit BBMX is replaced with a circuit BMX1. The circuit BMX1 differs from the circuit BBMX in that the circuits BNX and BPX are replaced with circuits BNX1 and BPX1.

According to another embodiment similar to FIG. 9A and illustrated in FIG. 9B, the bias voltages Vbp and Vbn can be generated in SS3 instead of being generated in BGN1. Therefore in BGN1 only the power supply management unit functions Vdd, Vd1, Gnd, are remaining while the two body bias voltages are generated in SS3. This body bias voltage generators are designed using known methods and supplied by Vd1, Vdd, and Gnd signals coming from the Power Management Unit. The body bias voltage generators output Vbp and Vbn, respectively, either connected directly to the processing unit PU (not shown) or connected to BMX1 corresponding inputs. There can be several processing units PU, each of them having its own BMX1, all being connected to a single body bias generator.

According to yet another embodiment similar to FIG. 9B and illustrated in FIG. 9C, the bias voltages Vbp and Vbn can be generated in a single generator circuit Gen of SS3 instead of being generated in BGN1 and instead of being generated in independent circtuits. BGN1 supplies only Vdd, Vd1, Gnd, while the body bias voltages are generated in SS3. This body bias voltage generator Gen is designed using known methods and it is supplied by Vd1, Vdd, and Gnd signals coming from the Power Management Unit. In the embodiment of FIG. 9C, a voltage selection circuit BMX1 (not shown) may be formed. Alternatively, the body bias voltage generator outputs Vbp and Vbn may be connected directly to the processing unit PU. There can be several processing units PU, each of them having its own Gen, or, a pluralit of processing units PU may be connected to a single body bias generator.

Figure 11A:
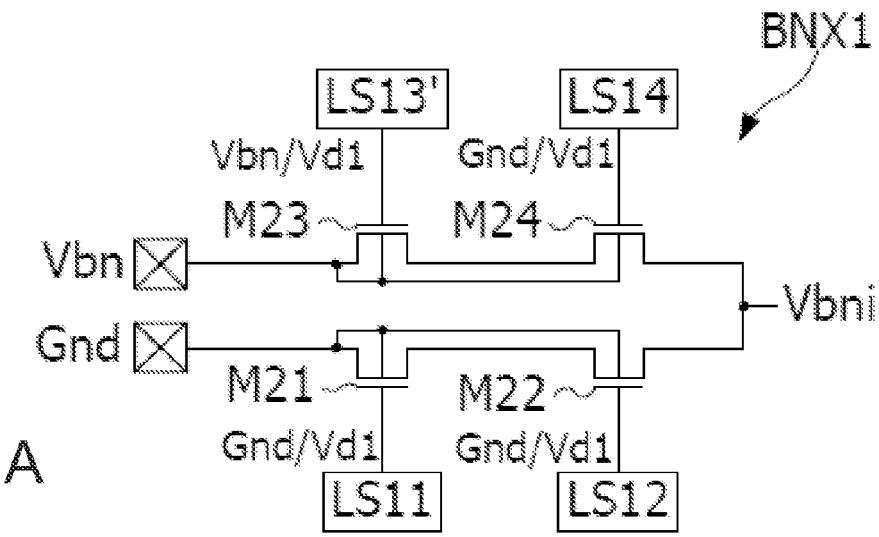
Figure 11B:
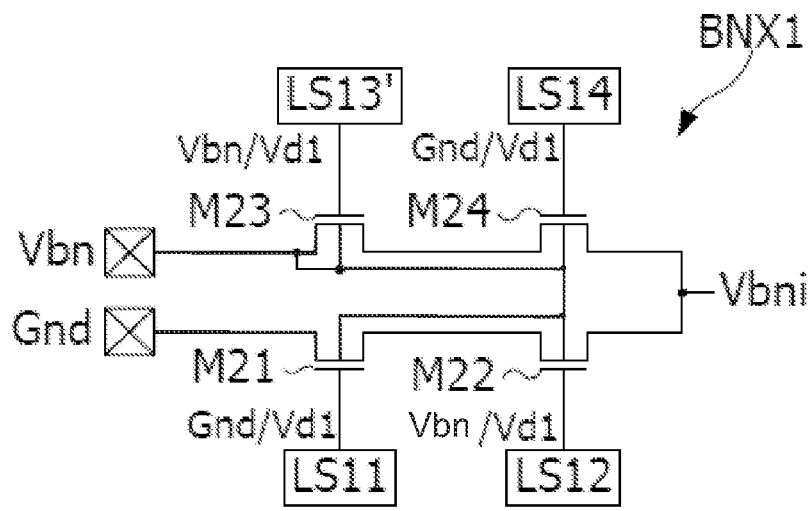
Figure 11C:
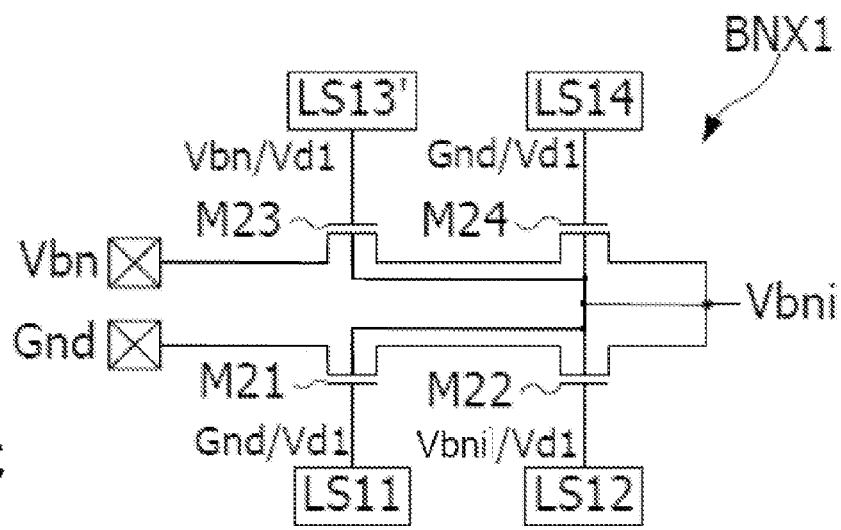

FIGS. 10 and 11A-11C respectively represent the circuits BNX1 and BPX1. Each of the circuits BNX1 and BPX1 only have two branches, one being connected to the terminal Vdd for the circuit BPX1 and to the terminal Gnd for the circuit BNX1, and the other being connected to the terminal Vbp for the circuit BPX1 and to the terminal Vbn for the circuit BNX1. The gate of the transistor M23 is controlled by a circuit LS13' providing either the voltage Vbn or the voltage Vd1. The gate of the transistor M22 in FIG. 11A is controlled by either Gnd or the voltage Vd1. The gate of the transistor M22 in FIG. 11B is controlled by either the voltage Vbn or the voltage Vd1. The gate of the transistor M22 in FIG. 11C is controlled by either the voltage Vbn or the voltage Vd1. The principles of operation in FIGS. 11B-11C that provide a larger voltage range in the negative voltage domain were described with respect to FIGS. 7B-7D.

The system SS3 can therefore command the power supply circuit BGN1 to activate one or other of the RBB and FBB modes, for example depending on the application being executed by the system, and particularly the activity/inactivity profile of the latter, given that the transitions from one mode to the other are not as critical in terms of response time of the electrical power supply as the transitions between the periods of activity and of inactivity of a unit of the system.

It will be understood by those skilled in the art that various alternative embodiments and various applications of the present invention are possible. In particular, the present invention is not limited to the bias voltage selecting circuits represented in FIGS. 6, 7A-7D, 10, and 11A-11C. Other circuits can easily be designed. For example, each branch of the circuits BPX, BNX, BPX1, BNX1 may include a single switch produced for example using only one MOS transistor biased and controlled to switch during a change in the activity level of the processing unit and only during such a change.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method to provide power to an integrated system, comprising:
providing the integrated system with supply, ground, and body bias voltages, the body bias voltages including a body bias voltage of p-channel MOS transistors, greater or lower than the supply voltage, and a body bias voltage of n-channel MOS transistors, lower or greater than the ground voltage;
selecting out of the voltages provided, voltages to bias bodies of MOS transistors of a processing unit in the integrated system; and
supplying through a branch the bodies of the n-channel MOS transistors of the processing unit with at least one of the voltages selected, the branch including three sub-branches, each sub-branch having only two n-channel branch transistors between an input of the respective sub-branch and an output of the respective sub-branch, the two n-channel branch transistors mounted in series such that at least one of the branch transistors is off when the respective sub-branch is not selected, a first one of the two n-channel branch transistors of a first sub-branch controllable with a first signal level or a second signal level, and a second one of the two n-channel branch transistors of the first sub-branch controllable with the second signal level or a third signal level, the first signal level, the second signal level, and the third signal level all different from each other.

2. A method according to claim 1, comprising:
selecting the voltages to bias the bodies of the MOS transistors of the processing unit out of the supplied voltages based on whether the processing unit is in a period of activity or a period of inactivity.

3. A method according to claim 2, comprising:
during the period of inactivity of the processing unit, supplying the bodies of p-channel MOS transistors of the processing unit with the bias voltage greater than the supply voltage, and supplying the bodies of n-channel MOS transistors of the processing unit with the bias voltage lower than the ground voltage.

4. A method according to claim 1 comprising:
during periods of activity or inactivity of the processing unit, supplying the bodies of p-channel MOS transistors of the processing unit with the supply voltage, and supplying the bodies of n-channel MOS transistors of the processing unit with the ground voltage.

5. A method according to claim 2, comprising:
during the period of activity of the processing unit, supplying the bodies of p-channel MOS transistors of the processing unit with the bias voltage lower than the supply voltage, and supplying the bodies of n-channel MOS transistors of the processing unit with the bias voltage greater than the ground voltage.

6. A method according to claim 1, comprising:
controlling a power supply circuit external to the integrated system to supply either the body bias voltage of p-channel MOS transistors greater than the supply voltage and the body bias voltage of n-channel MOS transistors lower than the ground voltage, or the body bias voltage of p-channel MOS transistors lower than the supply voltage and the body bias voltage of n-channel MOS transistors greater than the ground voltage.

7. A method according to claim 1 wherein the voltages to bias the bodies of the MOS transistors of the processing unit are selected by the processing unit.

8. A method according to claim 1, comprising:
controlling a power supply circuit external to the integrated system to adjust body reverse and forward bias voltages of p-channel MOS transistors of the processing unit to values respectively equal to the supply voltage plus and minus a voltage between 0 and 0.4 V.

9. A method according to claim 1, comprising:
controlling a power supply circuit external to the integrated system to adjust body forward and reverse bias voltages of n-channel MOS transistors of the processing unit to values respectively equal to the ground voltage plus and minus a voltage between 0 and 0.4 V.

10. A method according to claim 1 wherein the supply voltage of the integrated system varies between 50% and 120% of a nominal voltage withstood by the transistors of the integrated system.

11. An integrated system, comprising:
a processing unit; and
a body bias voltage selecting circuit coupled to the processing unit, the body bias voltage selecting circuit adapted to receive at least four voltage signals from a power supply circuit external to the integrated system, the four voltage signals including: 1) a supply voltage, 2) a ground voltage, 3) a body bias voltage of p-channel MOS transistors, greater or lower than the supply voltage, and 4) a body bias voltage of n-channel MOS transistors, lower or greater than the ground voltage, wherein the body bias voltage selecting circuit is configured to select voltages to bias bodies of MOS transistors of the processing unit, and the body bias voltage selecting circuit is configured to supply, via branch circuits, the bodies of the MOS transistors of the processing unit with the selected voltages wherein a branch circuit to supply the n-channel MOS transistors includes three sub-branches, each sub-branch having only two n-channel branch transistors between an its input of the respective sub-branch and an output of the respective sub-branch, the two n-channel branch transistors mounted in series and controllable via at least three different signal levels such that at least one of the branch transistors is off when the branch is not selected.

12. An integrated system according to claim 11, comprising:
several additional processing units, each processing unit coupled to a respective body bias voltage selecting circuit.

13. An integrated system according to claim 11, wherein the body bias voltage selecting circuit comprises:
a first circuit to select body bias voltages of p-channel MOS transistors out of the supply voltage and the body bias voltage greater or lower than the supply voltage; and
a second circuit to select body bias voltages of n-channel MOS transistors out of the ground voltage and the body bias voltage greater or lower than the ground voltage.

14. An integrated system according to claim 11, wherein the body bias voltage selecting circuit comprises:
a first circuit to select body bias voltages of p-channel MOS transistors out of the supply voltage and reverse and forward body bias voltages respectively greater and lower than the supply voltage; and
a second circuit to select body bias voltages of n-channel MOS transistors out of the ground voltage and forward and reverse body bias voltages greater or lower than the ground voltage.

15. An integrated system according to claim 13, wherein the first circuit to select body bias voltages of p-channel MOS transistors comprises:
one branch per p-channel MOS transistor body bias voltage, each branch configured to be supplied by an external power supply circuit, each branch having a p-channel MOS transistor and an n-channel MOS transistor mounted head-to-tail.

16. An integrated circuit, comprising:
at least one processing unit; and
a body bias voltage selecting circuit coupled to the processing unit and configured to select voltages to bias bodies of MOS transistors of the processing unit, the body bias voltage selecting circuit adapted to receive a plurality of power supply voltage signals, the plurality of power supply voltage signals including:
a body bias voltage greater or lower than a supply voltage and coupleable via a first branch circuit to p-channel MOS transistors, and
a body bias voltage lower or greater than a ground voltage and coupleable via a second branch circuit to n-channel MOS transistors,
wherein the first branch circuit includes a p-channel branch transistor and an n-channel branch transistor mounted head-to-tail such that at least one of the branch transistors is on when the branch is selected, wherein the second branch circuit includes three sub-branches, each sub-branch having two independently controllable n-channel branch transistors between an input of the respective sub-branch and an output of the respective sub-branch, the two n-channel branch transistors mounted in series such that at least one of the branch transistors is off when the respective sub-branch is not selected.

17. The integrated circuit according to claim 16, wherein a first n-channel branch transistor of the second branch circuit has a body bias connection to the ground voltage and a second n-channel branch transistor of the second branch circuit has a body bias connection to the body bias voltage lower or greater than the ground voltage.

18. The integrated circuit according to claim 17, wherein the second n-channel branch transistor of the second branch circuit is controllable via the body bias voltage lower or greater than the ground voltage.

19. The integrated circuit according to claim 16, wherein the body bias voltage greater or lower than the supply voltage and the body bias voltage lower or greater than the ground voltage are generated within the integrated circuit.

20. The integrated circuit according to claim 16, wherein the branch transistors of the first and second branch circuits are formed with thick oxide transistors relative to thin oxide transistors of the at least one processing unit.

* * * * *